(12) United States Patent
Sainty

(10) Patent No.: US 6,645,301 B2
(45) Date of Patent: Nov. 11, 2003

(54) ION SOURCE

(75) Inventor: Wayne G Sainty, Beecroft (AU)

(73) Assignee: Saintech Pty Limited, New South Wales (AU)

( * ) Notice: Subject to any disclaimer, the term of this patent is extended or adjusted under 35 U.S.C. 154(b) by 0 days.

(21) Appl. No.: 09/925,187

(22) Filed: Aug. 9, 2001

(65) Prior Publication Data

US 2002/0092473 A1 Jul. 18, 2002

(51) Int. Cl.[7] .................. B05C 11/00; C23C 16/00; C23C 14/00
(52) U.S. Cl. .............. 118/665; 118/723 R; 118/723 FI; 118/723 MP; 204/298.04; 204/298.11; 313/359.1; 313/361.1; 313/362.1; 313/363.1; 315/111.81; 315/111.91
(58) Field of Search .................. 204/298.04, 298.14, 204/298.08, 298.16, 298.06, 298.34, 298.36, 298.11; 118/723, 723 R, 723 FI, 723 MP, 665; 156/345.39, 345.4; 313/564, 566, 359.1, 361.1, 362.1, 363.1; 315/111.81, 111.91

(56) References Cited

U.S. PATENT DOCUMENTS

| | | | |
|---|---|---|---|
| 4,454,453 A | 6/1984 | Sugawara | .................. 315/106 |
| 4,863,549 A | 9/1989 | Grunwald | .................. 156/345 |
| 4,997,673 A | 3/1991 | Ogata et al. | .................. 427/38 |
| 5,252,178 A | 10/1993 | Moslehi | .................. 156/643 |
| 5,473,165 A | 12/1995 | Stinette et al. | ......... 250/492.21 |
| 5,711,860 A | 1/1998 | Jensen et al. | .......... 204/192.11 |
| 5,942,089 A | 8/1999 | Sproul et al. | .......... 204/192.13 |
| 6,238,537 B1 | 5/2001 | Kahn et al. | ............ 204/598.04 |
| 6,392,244 B1 | 5/2002 | Grannen | ................ 250/492.21 |

FOREIGN PATENT DOCUMENTS

| | | | | |
|---|---|---|---|---|
| GB | 2 123 441 A | 2/1984 | ........... | C23C/15/00 |
| WO | 96/22841 | 8/1996 | ........... | B05C/11/00 |
| WO | 98/48073 | 10/1998 | ........... | C23C/14/34 |
| WO | 01/55475 A2 | 8/2001 | ........... | C23C/14/22 |

OTHER PUBLICATIONS

JP 09092199 abstract.
JP 3222–095 A abstract.
JP 11273894–A abstract.

Primary Examiner—Steven H. VerSteeg
(74) Attorney, Agent, or Firm—Gordon & Jacobson, P.C.

(57) ABSTRACT

An ion source for use in ion assisted deposition of films, has an ionization region, a gas supply supplying ionizable gas to the ionization region, a gas excitation system causing ionization of the gas, ion influencing means forming the ions into a current directed at a target, and an ion source controller controlling the ion source so as to intermittently produce the ion current.

32 Claims, 5 Drawing Sheets

ION SOURCE

BACKGROUND OF THE INVENTION

This invention relates to ion sources used in Ion Assisted Deposition (IAD) of films, in particular optical quality films, and to methods of operating such ion sources.

Ion sources had their origins in space propulsion but more recently have found use in industrial processes such as IAD of thin film coatings. In an IAD process, an ion beam from an ion source is directed toward a target substrate to cause densification of the coating material as it is deposited. The process occurs within an evacuated chamber of pressure of the order $10^{-2}$ Pa or less.

The benefits that result from ion assistance, during growth, of almost any optical material is well understood and is today widely practiced. In general, ion bombardment provides close to bulk density of the film resulting in dramatic improvements in durability and performance. However, for many classes of materials this benefit is accompanied by an undesirable modification of optical properties observed as an increasing absorption coefficient (k) and variability in refractive index (n). For many classes of materials, this problem results from incompatibility between the ion species and depositing material.

Argon and oxygen are the two most predominant species of ions used in IAD processes. The high momentum of Ar+ provides high packing density, although usually leads to a reduction of metal oxides and fluorine depletion of most metal fluorides. This results in metal-rich films with a subsequent increase in optical absorption.

The use of O+ is well suited to the IAD of metal oxides such as titania, silica etc. With the correct choice of energy and ion current density, O+ IAD can provide fully densified and low-stress films. Problems arise however where the very chemically active oxygen ions displace fluorine atoms from depositing molecules immediately prior to their incorporation in the film. This leads to the growth of oxy-fluorides with subsequent deterioration of optical properties. The extent to which this occurs depends on factors such as ion energy and current.

SUMMARY OF THE INVENTION

In a first aspect, the invention resides in an ion source including:
an ionization region;
a gas supply;
a gas excitation system;
ion influencing means; and
an ion source controller;
wherein said gas supply supplies an ionizable gas to said ionization region;
wherein said gas excitation system causes ionization of gas in said ionization region;
wherein said ion influencing means forms ions produced in said ionization region into an ion current substantially directed at a target;
and wherein said ion source controller controls said ion source so as to intermittently produce said ion current.

In a first embodiment, gas is intermittently introduced into the ionization region.

In a second embodiment, the flow of electrons into the ionization region is made intermittent.

In a further embodiment the ion source of the present invention is combined with a film deposition apparatus, the combined apparatus including a deposition control system that prevents deposition of new material onto the target substrate while the ion current is directed towards the target.

BRIEF DESCRIPTION OF THE DRAWINGS

Further features and advantages of the invention will become apparent to the skilled reader from the following description of preferred embodiments made with reference to the accompanying Figures in which.

DETAILED DESCRIPTION OF PREFERRED EMBODIMENTS

In a typical ion source, electrons are drawn from a cathode filament toward an anode through an ionizable gas. Collisions between the gas molecules and energetic electrons create a source of positive ions by inducing a plasma. In one type of ion source known as a gridless ion source, a magnetic field is applied across the plasma to shape the ions accelerated from the ion source into an ion beam. In a specific type of gridless ion source, known as an end-Hall effect ion source, the axis of the magnetic field is aligned with the electric potential between the cathode and the anode. The interaction of the magnetic and electric fields causes the charged particles to approximately follow the magnetic field lines. The anode in these devices is typically annular having an outwardly inclined inner diameter with the bulk of the plasma forming within the confines of the anode walls.

A specific ion source is described below but it is to be understood that the description is for illustrative purposes only. The present invention can be suitably adapted for use with any one of several known ion sources.

Figure 1:
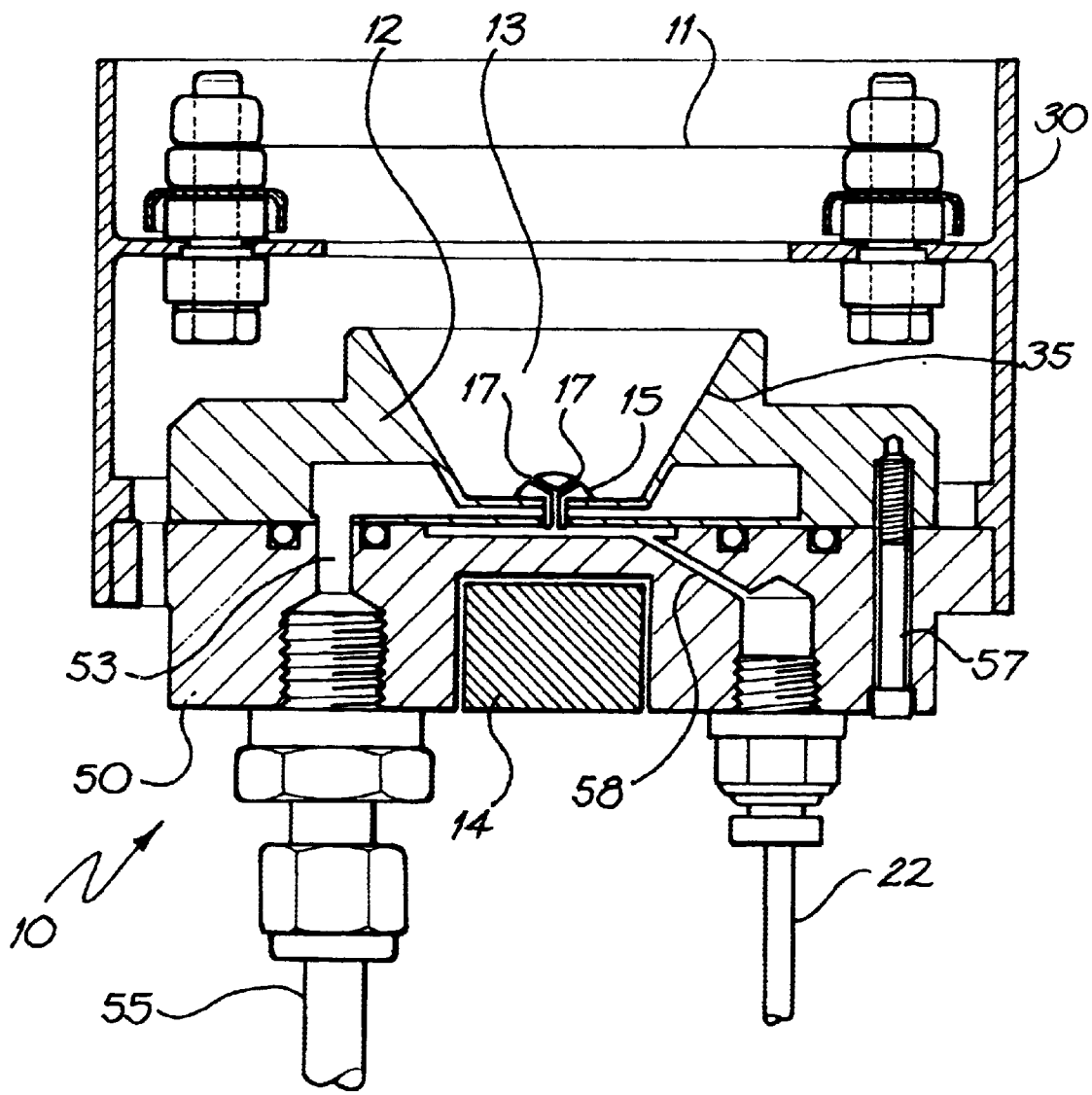
FIG. 1 is a partial cross-sectional elevation of the ion source according to the invention.
Figure 2:
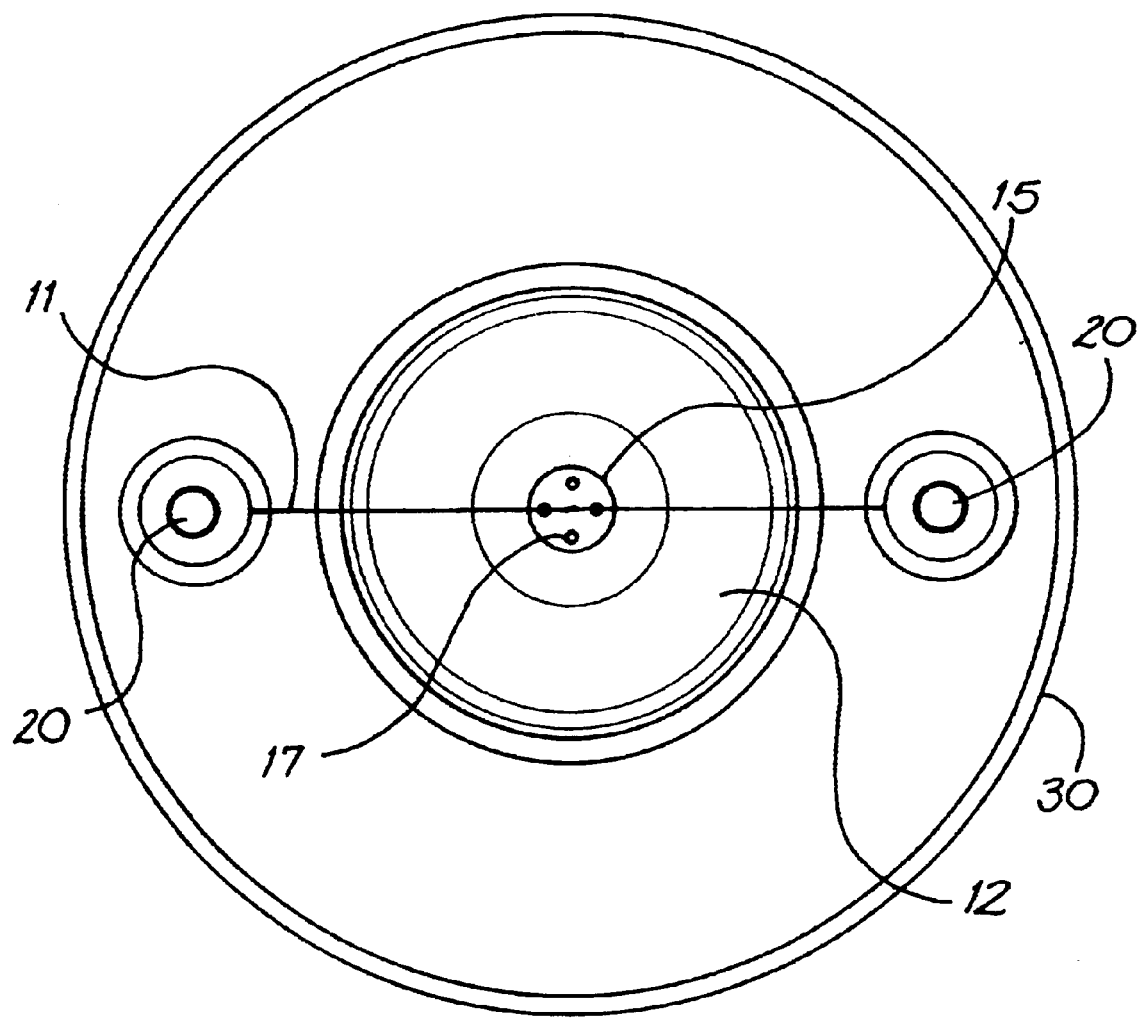
FIG. 2 is a plan view of the ion source in FIG. 1.

FIGS. 1 and 2 show an ion source generally at 10 having a cathode wire 11 and an anode 12. The anode 12 is an annulus having an inner surface 35 sloping outwards in the direction of the cathode. Between the cathode 11 and the anode 12 is an ionization region 13. The cathode wire 11 is suspended above the anode by two mounting pins 20 that are held by, and in electric isolation from, a shield plate 30. The shield plate 30 substantially surrounds the anode, cathode and ionization region by extending from a point lower than the anode 12 to a point above the cathode 11 and is preferably maintained at earth potential to shield the anode and the cathode from external fields. A magnet 14 is disposed outside the ionization region 13 but adjacent the anode 12. The magnet 14 creates a magnetic field, the longitudinal axis of which is aligned with the axis of the anode 12. The magnet may be a permanent magnet or an electromagnet. Preferably the magnet is a high flux rare earth magnet such as a NdFeB magnet. As an alternative, magnet 14 may be a ring magnet disposed around the anode 12 and ionization region 13.

The alignment of the magnetic field with the electric field causes electrons emitted by the cathode to approximately follow the magnetic field lines as they move towards the anode. This has the effect of concentrating the flow of electrons toward the axis of the magnetic field. Therefore the region where the magnetic field intensity is a maximum, will also be a region of maximum electron flux.

The ionizable gas, for example oxygen, nitrogen or argon, is supplied to the ionization region through a gas flow path from gas feed line 22. The gas flow path terminates at an outlet member 15. The outlet member 15 has the form of a gas shower head, with a plurality of apertures 17, that introduce the gas into the ionization region 13 in a substantially random direction. The gas shower head 15 is disposed on the axis of the anode and adjacent the ionization region 13 such that gas emanating from the apertures 17 enters the ionization region at a point of high electron flux. Because a large proportion of ionization occurs close to the outlet, the gas shower head is of a material such as stainless steel, that withstands the very high energy from the incoming electron flux.

The anode 12 preferably has disposed within it a channel 53 in communication with a fluid conduit 55 that provides water to cool the anode. The channel 53 preferably extends into the body of the outlet member 15.

The anode 12, outlet member 15 and shield 30 are mounted on a non conductive mounting base 50 through which extends the gas flow path and fluid conduit 55. A plurality of mounting screws 57 fix the anode 12 to the base 50. The magnet 14 is housed within the base such that the external pole is exposed. The mounting base 50 has a conduit 58 that forms part of the gas flow path and connects the gas feed line 22 to the outlet member 15 such that no electrical connection can be made between the outlet member 15 and the gas feed line 22. The mounting base 50 has a similar conduit for connecting the water feed line 55 to the channel 53. The gas and water feed lines preferably screw into the mounting base 50. A suitable material for the mounting base 50 is glass filled polytetrafluoroethylene. This arrangement reduces electrical hazards, simplifies mounting and installation and reduces risk of secondary plasmas forming within the gas feed line.

The size of the outlet is preferably half or less than the smallest inner diameter of the anode in order that a localised high pressure zone is created around the outlet, that decreases rapidly with distance.

In operation the anode is charged in the range 0–500 V, preferably 250 V relative to the cathode which is at or near earth potential. A DC current of approximately 12 A is passed through the cathode to stimulate electron emission. An AC current may be used but the combination of an alternating current and the magnetic field has been found by the present inventor to cause vibrations in the cathode which reduces the cathode lifetime. Electrons generated at the cathode are influenced by the anode potential and are accelerated toward it. The magnetic field imparts a spiral motion on the electrons further increasing their kinetic energy and thus their potential to ionize gas molecules, and focussing the electrons toward the longitudinal axis. Collisions between the energetic electrons with gas molecules emitted from the outlet member 15 cause ionization. If sufficient ionizing collisions occur then a plasma is formed. Positive ions created in the plasma experience the opposite effect to the electrons. The ions initially have a random velocity but are influenced by the electric potential gradient which accelerates them toward and past the cathode 11. The magnetic field in this case acts to control the direction in which the ions are expelled from the ion source by focusing them into an ion beam or ion current centred on the longitudinal axis of the magnetic field. By properly aligning the axis of the magnetic field, the ion beam can be directed toward a target. Further features of the above described ion source can be obtained from the present applicant's co-pending application no. PCT/AU99/0059 1, the contents of which are incorporated herein by reference.

Figure 3A:
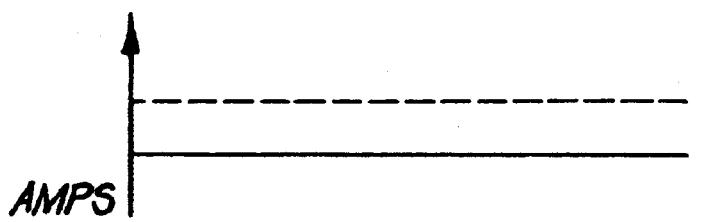
FIG. 3 shows an example of a cathode filament waveform signal.
Figure 3B:
Figure 3C:
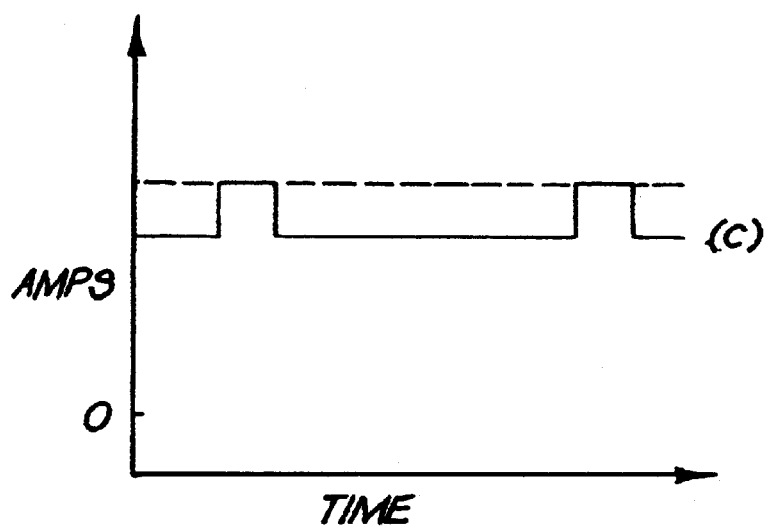

In a first embodiment, the cathode filament 11 is connected to a DC power supply that incorporates a variable waveform signal generator. The cathode filament has a DC biased current of 8–9 A which is at least 70% and preferably 75–95% of the threshold current required for thermionic emission (shown in broken line in FIG. 3). This current is supplied to the filament as a continuous wave (CW) signal (FIG. 3a). Superimposed on the base signal is a square pulse signal of approx 3 A (FIG. 3b). The combined signal (FIG. 3c) is sufficient to produce thermionic emission during peak periods of the supplementary pulse signal. Because electron emission from the cathode, and subsequently gas ionization, only occurs when there is sufficient cathode current, the ion source will only produce an ion current during peak times of the cathode current cycle. When the pulse signal finishes and the total filament current returns to the base level there is no thermionic electron emission to excite ionization of the gas and thus the ion beam current falls to zero.

The size of the basic filament signal and the pulse signal can be varied by the signal generator depending upon requirements and the type of cathode filament employed, as can the duty cycle and frequency of the pulse signal.

The present inventor has found it suitable to bombard the target with ions for between 0.5 and 5 seconds, preferably 1 second, for every 5 to 30 nm, preferably 10–20 nm of deposition, which corresponds approximately to having a cathode filament pulse signal period of approx 5 to 50 seconds, preferably 10 seconds, with duty cycle of 5% to 30%, preferably 10%. With these parameters, the ion beam current grows and decays on a time scale much, shorter than the length of time for which the ion beam current is on during each cycle.

By providing the filament with a CW base current to which is added a periodic pulse current, as opposed to providing one pulse signal of greater amplitude, thermal shock of the filament is prevented thereby increasing filament lifetime.

Figure 4:
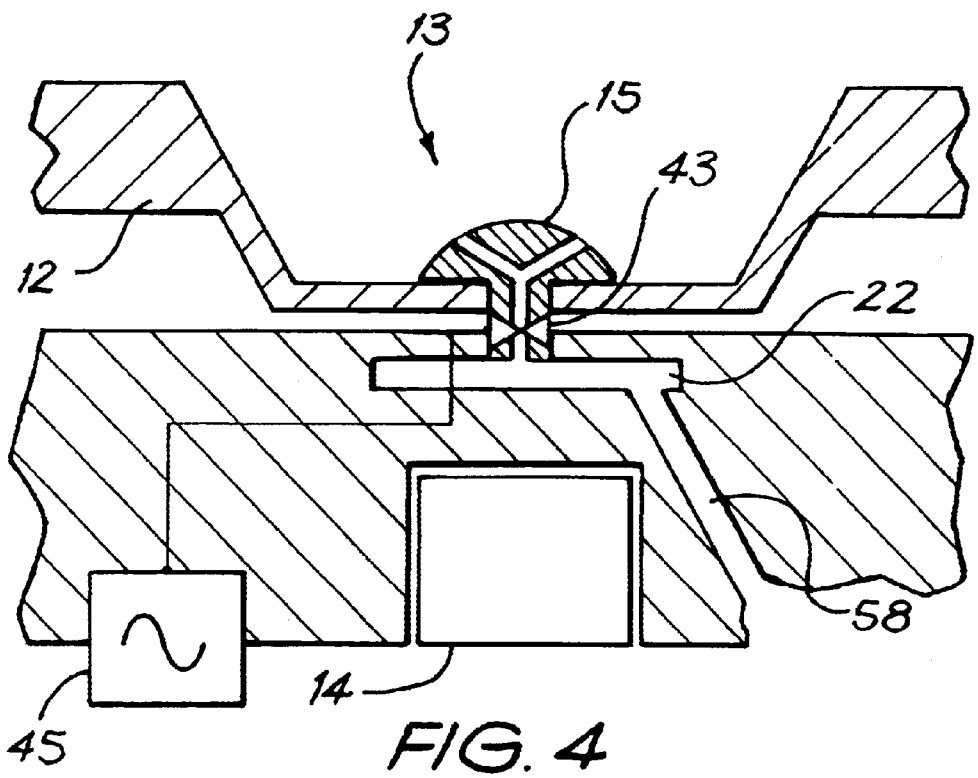
FIG. 4 is a side view of a gas delivery system with a generic control valve adjacent the outlet.

An alternative embodiment for producing an intermittent ion beam current is described with reference to FIG. 4. In this embodiment, it is the flow of gas into the ionization region that is cyclic. FIG. 4 shows a gas outlet 15 that is disposed adjacent the ionization region of the ion source. The outlet is supplied with gas through a gas feed line 22.

An electrically controlled valve 43 within the gas flow path 22 is provided with a signal from the signal generator 45 to control its opening and closing thereby governing the flow of gas into the ionization region 13.

The waveform used to control the operation of the valve can be the same square pulse wave used in the cathode filament embodiment discussed above. However, the rise time of the ion beam current and its subsequent decay will be longer than for the embodiment of the cyclic filament current discussed above due to the lag in gas entering the ionization region once the valve 43 is open and residual diffusion of gas from the gas path downstream of the valve 43 once the valve is closed. Therefore the pulse which is used to keep the control valve 43 open may need to be slightly longer than the analogous filament current pulse in order to provide the same effective ion beam current intensity and duration. It is also important that the valve 43 be placed as close to the outlet as possible to reduce the amount of residual gas in the feed line downstream of the valve once the valve is closed.

Figure 5:
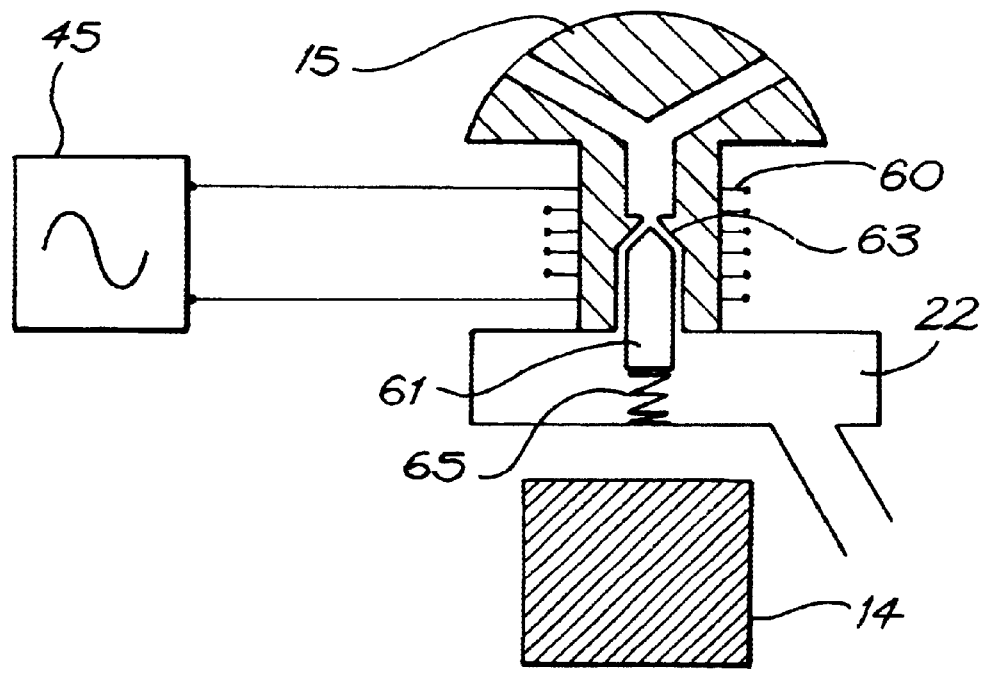
FIG. 5 is shows an example of an outlet control valve.

One proposed embodiment for the valve is discussed with reference to FIG. 5 in which a solenoid coil 60 is wrapped around the gas feed line 22. An armature 61 disposed within the gas line 22 in a first position engages a valve seat 63 to close the valve and in a second position allows gas to flow through the line to the outlet. The armature 61 is ferromagnetic and/or paramagnetic and in normal conditions will be biased, either by a spring 65 or by the magnetic field of the rare earth magnet 14 used for controlling expulsion of ions from the plasma, to close the valve. A change in the electric current in the solenoid 60 as governed by the waveform from the signal generator 45 creates a change in the local magnetic conditions around the armature 61. This has the effect of drawing the armature 61 away from the valve seat 63 thereby allowing gas flow. A reverse change in the charging state of the solenoid causes the armature 61 to re-engage the valve seat 63.

It is preferred that the armature 61 be magnetised such that in the absence of the solenoid field, the armature 61 is repelled by the rare earth magnet 14 to the closed position. When the solenoid is charged the solenoid field overcomes the field from the magnet 14 and acts to open the valve. In this way, the gas line remains closed in the absence of any power.

In an alternative system, the valve may be a piezo-valve opened and closed as the governing signal from the waveform generator goes between high and low values.

In a further embodiment, one or more gas injectors can be used in place of the gas outlet and valve. The gas injectors inject a measured volume of gas into the ionization region. The timing of the gas injection can be controlled by the waveform generator. An advantage of periodic or cyclic gas flow is that the overall amount of gas provided to the ionization region can be reduced because no gas is provided during times when no ion current is required, and thus smaller and/or cheaper vacuum pumps can be used to achieve the low pressures required for optimum IAD conditions.

A more significant advantage is that with pulsed gas flow it is possible to achieve higher localised gas pressures in the ionization region whilst still maintaining a low background pressure for the same pump system. This is because the average gas flow and thus the average background pressure over a number of cycles is lower for pulsed gas flow than for continuous gas flow conditions using the same gas flow rates. The system can thus tolerate higher gas flow rates during the on-phase of the gas flow cycle without introducing instabilities into the system that are caused by high background pressures. The higher gas flows create higher ionization region. pressures giving rise to higher ion beam currents.

A further method for creating a pulsed ion beam current is to provide the ion source anode 12 with a square pulse waveform voltage ranging from 0 V to its normal operating voltage eg 250 V, relative to the cathode. When the anode voltage is high, the ion source operates as normal to produce an ion beam current. When the anode voltage goes low, electrons created at the cathode are not influenced by the anode voltage and thus do not preferentially accelerate toward the ionization region. Thus minimal excitation collisions occur and no meaningful ion beam is produced.

Further methods for producing a cyclic ion beam may be possible. For example, in ion sources where an electromagnet is used to shape and direct the ion beam, the electromagnet may receive a pulsed signal so that the directional effects that cause the ions to flow toward the target are produced only intermittently.

It is of course possible to combine any of the above described methods to produce an intermittent ion beam current.

Figure 6:
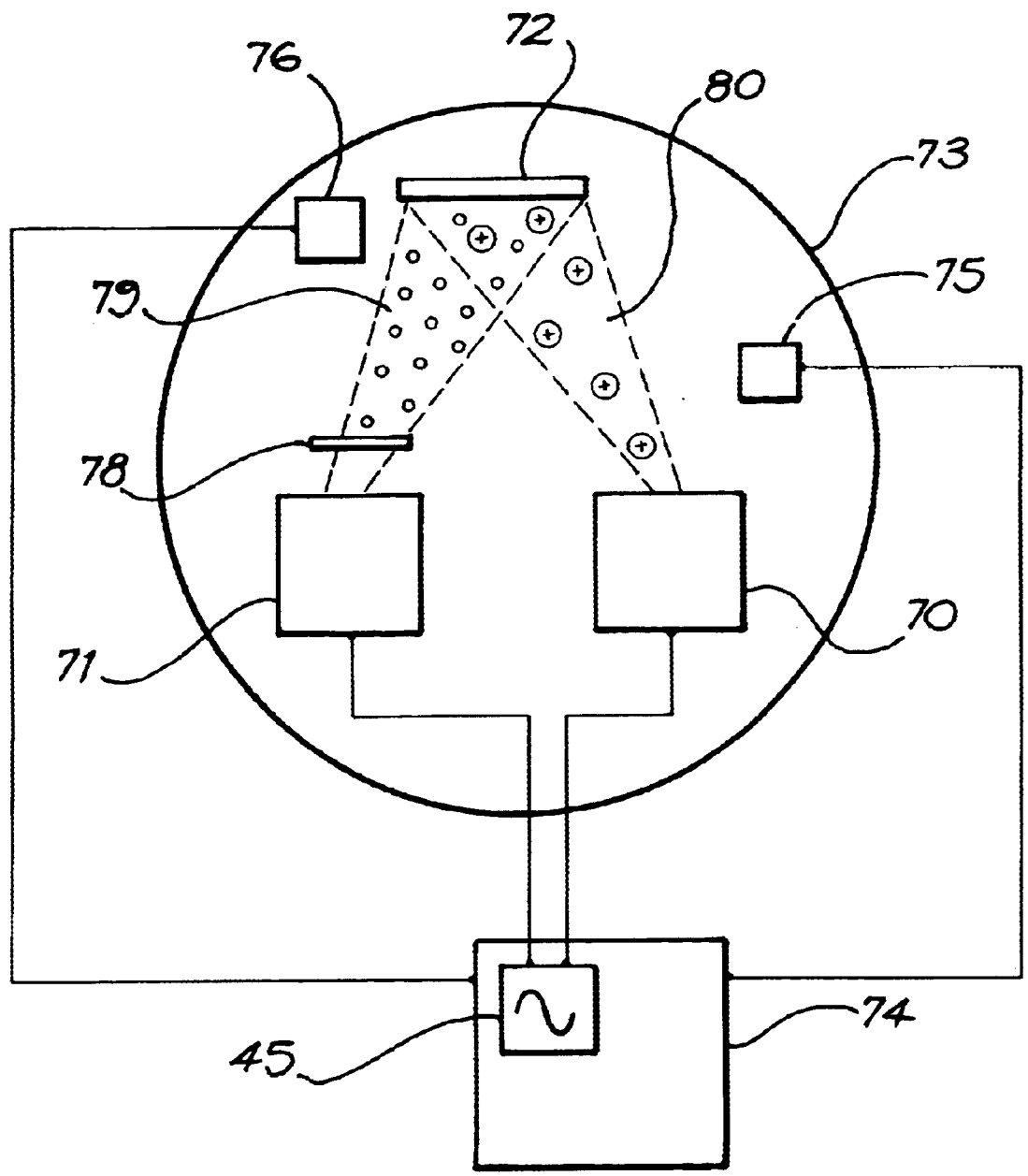
FIG. 6 is a schematic of an ion source combined with IAD deposition apparatus.

Referring to FIG. 6 there is schematically shown an ion assisted thin film deposition system including an ion source 70 according to the invention, deposition apparatus 71 and a target substrate 72 all disposed within a vacuum chamber 73. The power supply 74 operating the ion source includes a waveform generator 45 used to produce a periodic ion beam 80 directed toward the target substrate 72. The deposition apparatus 71 produces the vapour stream of material 79 to be deposited and may employ any known technique used in physical vapour deposition, such as thermal evaporation or electron beam evaporation. The specific vaporisation techniques used will depend on the type of material being deposited and the substrate type.

In operation, a pre-determined thickness of material is deposited, without ion assistance, which results in the growth of a stoichiometric deposit with low packing density. The deposited film is then bombarded with a short-duration high-energy pulse of ions. This procedure is repeated until the full thickness of film is achieved. The result is a strongly adherent, stoichiometric film with good bulk density and optical properties.

In a most preferred form of the invention, deposition of the coating material onto the target 72 also occurs cyclically with each of the stages of deposition and ion bombardment occurring non-concurrently, that is, to the exclusion of the other stage. The waveform generator 45 can be used to control the vaporisation apparatus 71 with a signal the temporal inverse of the signal used to control the ion source. The target 72 thus receives a repeated cycle consisting of exclusive and distinct deposition and ion bombardment stages.

In an alternative form, the vaporisation apparatus may have a shutter member 78 that is actuated at the start of the ion bombardment phase of the total process cycle to block the stream of deposition material 79 to the substrate so that further deposition material is prevented from reaching the target whilst ion bombardment is occurring. The shutter can be controlled by the same waveform from the waveform generator that controls the ion source. On completion of the ion bombardment phase the shutter is moved out of the stream of deposition material.

Instead of using the waveform generator to trigger production of the ion beam current, the ion source may use an external trigger. For example, the ion source may receive feedback from a deposition monitor 76, e.g. a quartz crystal monitor, that measures growth of the deposited film in situ. Once a predetermined thickness of film has been deposited a control signal may be generated to trigger the ion source to provide a pulse of ions causing densification of the most recently deposited film. The pulse size and duration may still be governed by the waveform generator or by other means. The same trigger used to activate the ion beam may control the vaporisation apparatus and/or shutter member to prevent further film material from being deposited on the substrate during ion bombardment.

The duration of the ion bombardment phase is predetermined by the pulse length setting on the waveform generator.

At the conclusion of the ion bombardment phase, the pressure may be higher than is required or desirable for the deposition phase due to the injection of gas into the ion source. A pressure transducer 75 disposed within the vacuum chamber can measure the chamber pressure which the system can use to prevent the deposition process from recommencing until the pressure is below a predetermined level.

Case Study 1: Magnesium Fluoride

Magnesium fluoride is a very commonly used thin film material for application to both single and multi-layer anti-reflection coatings. It possesses a low refractive index (n=1.35 at 550 nm) and a transparency range from the deep ultraviolet to the far infrared. Conventional deposition requires high substrate temperatures (=300° C.) which can increase processing time in multi-stage processes and considerably, increase the risk of damaging thermally sensitive substrates. Comparative results for deposition of magnesium fluoride with continuous and periodic ion bombardment of the target are shown in Table 1 below.

TABLE 1

| Method of Deposition | Properties | n @550 nm |
|---|---|---|
| Evaporated-unheated substrates | Soft, easily damaged low packing density, high stress, unstable | 1.35 |
| Evaporated-hot 300° C. | More durable, n increasing | 1.39 typical |
| IAD O+, cold | Dense, n increasing | 1.40–1.43 |
| IAD Ar+, cold | Dense, k increasing | 1.40 |
| PULSED O+ IAD* Unheated substrates | Very durable, High transparency | 1.35 (bulk) |

*Ion assisted with 250 eV oxygen ion energy, 750 mA pulses with 10% duty cycle

Case Study 2. Calcium Fluoride

Bulk calcium fluoride possesses the lowest refractive index of any thin film material with an index of n=1.21 (bulk) at 550 nm. The material has a very wide transparency range comparable to magnesium fluoride above. Evaporated $CaF_2$ thin films have a packing density of only 50%–60% and are thus extremely soft and easily damaged, making it almost essential that they are used in a clean environment as wiping will quickly damage the coating. Table 2 shows comparative data for calcium fluoride films deposited with and without pulsed ion bombardment.

TABLE 2

| Method of Deposition | Properties | n @550 nm |
|---|---|---|
| Thermally evaporated-cold | Very fragile and unstable, large vacuum to air shift, uncleanable. | =1.20 in vacuum =1.28–1.30 in air |
| PULSED-O+ IAD* Unheated substrates | Soft but stable films negligible vacuum to air shift. Cleanable. | =1.22 to 1.23 |

*Ion assisted with 200 eV oxygen ion energy, 500 mA pulses with 8% duty cycle

Because the ion source of the present invention operates in a cyclic mode so that the ion beam is only produced for brief periods, instabilities that grow within the ion source during the on-phase may not be fatal to the ion source's operation if the ion source switches to the off phase before a catastrophic event, such as the development of a vacuum arc, occurs. For example, it may be possible to have a higher gas flow rate during the on-phase of a pulsed ion beam system than for a continuous system, giving rise to a higher ion beam current, because by the time the pressure outside the ionization region reaches the levels where vacuum arcs may occur, the waveform signal will go low thus switching off the gas flow. The potential instability will then stabilise before the next on-phase of the cycle commences.

Using an intermittent ion beam in ion assisted deposition of films prevents or at least reduces the problems discussed above of prior art IAD systems such as ion species depletion and displacement. This is because minimal new material is deposited during the ion bombardment phase of the cycle. Thus the ion beam serves only as a source of energy for densifying the already deposited material. The problems of the prior art can be further reduced by excluding deposition totally during the ion bombardment phase.

The present invention has further enabled the production of stable, optical quality UV films.

While particular embodiments of this invention have been described, it will be evident to those skilled in the art that the present invention may be embodied in other specific forms without departing from the essential characteristics thereof. The present embodiments and examples are therefore to be considered in all respects as illustrative and not restrictive, the scope of the invention being indicated by the appended claims rather than the foregoing description, and all changes which come within the meaning and range of equivalency of the claims are therefore intended to be embraced therein. It will further be understood that any reference herein to known prior art does not, unless the contrary indication appears, constitute an admission that such prior art is commonly known by those skilled in the art to which the invention relates.

I claim:

1. An ion source including:
   an ionzation region;
   a gas supply;
   a gas excitation system;
   ion influencing means; and
   an ion source controller;
   wherein said gas supply supplies an ionizable gas to said ionization region;
   wherein said gas excitation system causes ionization of gas in said ionization region;
   wherein said ion influencing means forms ions produced in said ionization region into an ion current substantially directed at a target;
   and wherein said ion source controller controls said ion source so as to intermittently produce said ion current.

2. An ion source according to claim 1 wherein said ion source controller includes a signal generator producing a regular waveform signal controlling the production of said ion current.

3. A thin film deposition system including:
   deposition apparatus; and
   an ion source according to claim 1;
   wherein said deposition apparatus ejects a stream of deposition material towards a target, and
   wherein deposition of material onto the target is substantially prevented whilst the target is subjected to said ion current.

4. A system according to claim 3 further including a shutter member that substantially blocks said stream of deposition material whilst the target is subjected to said ion current.

5. A system according to claim 4 wherein said shutter member is controlled by said ion source controller.

6. A system according to claim 5 wherein said ion source controller includes a signal generator producing a pulse waveform signal that controls said ion source and said shutter member.

7. A system according to claim 3 further including a pressure monitor wherein said pressure monitor measures the pressure of said system and wherein deposition of material onto the target recommences in response to a pressure measurement below a predetermined level.

8. A thin film deposition system including:
deposition apparatus;
an ion source according to claim 1;
and a deposition monitors,
wherein said deposition apparatus ejects a stream of material toward a target,
wherein said deposition monitor monitors the increase in thickness of material deposited on said target,
wherein said deposition monitor triggers said ion source to commence production of said ion current in response to a measured increase in deposited material above a predetermined level, and
wherein said ion source controller controls said ion source to produce said ion current for a predetermined duration.

9. A system according to claim 8 wherein said predetermined level is between 5 and 30 nm.

10. A system according to claim 8 wherein said predetermined duration is between 0.5 and 5 seconds.

11. An ion source including:
an ionization region;
a gas supply;
a cathode;
a cathode emission controller;
an anode
an electric potential generator; and
ion influencing means;
wherein said gas supply supplies an ionizable gas to said ionization region;
wherein said cathode is disposed at one end of said ionization region;
wherein said anode is disposed at an opposite longitudinal end of said ionization region;
wherein said cathode emission controller causes said cathode to emit electrons;
wherein said electric potential generator generates an electric potential between said cathode and said anode;
wherein said generated electric potential causes electrons emitted by said cathode to accelerate in the direction of said anode;
wherein electrons moving toward said anode bombard said ionization gas to produce ions;
wherein said ion influencing means forms ions produced in said ionization region into an ion current substantially directed at a target;
and wherein said cathode emission controller causes intermittent emission of electrons from said cathode such that said ion source produces an intermittent ion current.

12. An ion source according to claim 11 wherein said cathode emission controller generates a waveform current signal that is provided to said cathode to stimulate emission of electrons from said cathode.

13. An ion source according to claim 11 wherein said cathode emission controller generates a DC current signal that is provided to said cathode to stimulate emission of electrons from said cathode, wherein said DC current signal includes a continuous base current signal below a threshold current required for electron emission from said cathode and an intermittent pulse current signal superimposed on said base current signal and wherein the combination of said base current and said pulse current is above the threshold current required for electron emission from said cathode.

14. An ion source according to claim 13 wherein the pulse current signal has a duty cycle between 5% and 20%.

15. An ion source according to claim 13 wherein the total current to said cathode is above the threshold for electron emission for 5 to 20% of the total signal period.

16. An ion source including:
an ionization region;
a gas supply;
a gas excitation system;
ion influencing means; and
a gas flow controller;
wherein said gas supply supplies an ionizable gas to said ionization region;
wherein said gas excitation system causes ionization of gas in said ionization region;
wherein said ion influencing means forms ions produced in said ionization region into an ion current substantially directed at a target;
and wherein said gas flow controller controls the flow of gas into said ionization region so as to intermittently produce said ion current.

17. An ion source according to claim 16 wherein the commencement of said ion current is in response to an external trigger received by said ion source controller, said ion source controller further including a timer for controlling the duration of said ion current.

18. An ion source according to claim 16 wherein said gas supply includes a gas line, an outlet in said gas line to said ionization region and a valve disposed in said gas line to control the flow of gas to said outlet, wherein said gas flow controller includes a signal generator and wherein said signal generator generates a signal to control the opening and closing of said valve.

19. An ion source according to claim 18 wherein said valve is substantially adjacent said outlet.

20. An ion source according to claim 18 wherein said signal is a regular pulse waveform signal.

21. An ion source according to claim 20 wherein said regular pulse waveform signal has a duty cycle of between 5% and 30%.

22. An ion source according to claim 18 wherein said valve is electrically controlled by a signal from said signal generator.

23. An ion source according to claim 18 wherein said valve includes a valve seat formed in said gas line, an armature disposed in said gas line, and a coil disposed around said gas line, wherein said armature is adapted to sealingly engage said valve seat to prevent the flow of gas through said gas line, wherein said coil is charged by a signal from said signal generator, and wherein said armature disengages said valve seat in response to a change in the charging state of said coil.

24. An ion source according to claim 23 wherein said armature is biased towards a position in which said armature engages said valve seat.

25. An ion source according to claim 24 further including a magnet, wherein the magnetic field from said magnet biases said armature to engage said valve seat.

26. An ion source according to claim 16 wherein said gas supply includes one or more gas injectors, wherein said gas injectors inject a measured amount of gas into said ionization region and wherein the injection of gas from said gas injectors is controlled by said gas flow controller.

27. A thin film deposition system including deposition apparatus and an ion source according to claim 16 wherein said deposition apparatus ejects a stream of deposition material toward said target.

28. An ion source including:

an ionization region;

a gas supply;

a cathode;

a cathode emission controller;

an anode;

a magnetic field generator; and an electric potential generator;

wherein said gas supply supplies an ionizable gas to said ionization region;

wherein said cathode is disposed at one end of said ionization region;

wherein said anode is disposed at an opposite longitudinal end of said ionization region;

wherein a longitudinal axis lies substantially between said anode and said cathode;

wherein said magnetic field generator generates a magnetic field the axis of which lies substantially parallel to said longitudinal axis;

wherein said cathode emission controller causes said cathode to emit electrons;

wherein said electric potential generator generates an electric potential between said cathode and said anode;

wherein said generated electric potential causes electrons emitted by said cathode to accelerate in the direction of said anode;

wherein electrons moving toward said anode bombard said ionizable gas to produce ions;

wherein said electric potential and said magnetic field act together to form ions produced in said ionization region into an ion current substantially directed at a target;

and wherein said electric potential is generated intermittently such that said ion source produces an intermittent ion current.

29. An ion source according to claim 28 wherein said electric potential generator provides an electric potential to said anode that causes electrons emitted by said cathode to accelerate in the direction of said anode.

30. An ion source according to claim 28 wherein said gas supply includes a gas line passing substantially through said anode, said gas line terminating in an outlet in said ionization region;

wherein said ion source includes a longitudinal axis extending generally between said anode and said cathode;

wherein said anode is substantially centered on said longitudinal axis;

wherein said outlet is disposed on said longitudinal axis of said ion source; and wherein said outlet includes a plurality of apertures.

31. An ion source according to claim 28 wherein said ion source includes a longitudinal axis extending generally between said anode and said cathode, said ion source further including a magnetic field generator, wherein said magnetic field generator generates a magnetic field the axis of which lies substantially parallel to said longitudinal axis.

32. A control system for controlling an ion-assisted deposition process including:

a deposition monitor;

a pressure monitor;

an ion source controller; and a deposition controller;

wherein said deposition monitor monitors the increase in thickness of deposition material on a substrate, wherein said pressure monitor measures the pressure within a vacuum chamber in which said ion assisted deposition process occurs, wherein a first control signal is generated in response to a measurement by said deposition monitor of an increase in thickness of deposited material on said substrate above a predetermined amount, wherein said deposition controller causes deposition of material onto said substrate to cease in response to said first control signal, wherein said ion source controller causes an ion source to produce an ion current directed at said substrate for a pre-determined duration in response to said first control signal, wherein said ion current is produced from an ionizable gas wherein after the expiration of said predetermined duration a second control signal is generated in response to a measurement of pressure by said pressure monitor below a predetermined pressure, and wherein said deposition controller causes the deposition of material on said substrate to recommence in response to said second control signal.

* * * * *